United States Patent
Chen et al.

(10) Patent No.: US 9,525,079 B2
(45) Date of Patent: Dec. 20, 2016

(54) PHOTOELECTRICAL COVERSION MODULE

(71) Applicant: AU Optronics Corporation, Hsin-Chu (TW)

(72) Inventors: Yung-Chih Chen, Hsin-Chu (TW); Huang-Chi Tseng, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 255 days.

(21) Appl. No.: 14/243,144

(22) Filed: Apr. 2, 2014

(65) Prior Publication Data

US 2014/0299185 A1  Oct. 9, 2014

(30) Foreign Application Priority Data

Apr. 3, 2013 (CN) .......................... 2013 1 0115449

(51) Int. Cl.
| | |
|---|---|
| *H01L 31/00* | (2006.01) |
| *H01L 31/02* | (2006.01) |
| *H01L 31/048* | (2014.01) |
| *H01L 31/05* | (2014.01) |

(52) U.S. Cl.
CPC ....... *H01L 31/02013* (2013.01); *H01L 31/048* (2013.01); *H01L 31/0504* (2013.01); *H01L 31/0508* (2013.01); *Y02E 10/50* (2013.01)

(58) Field of Classification Search
CPC ........... H01L 31/02013; H01L 31/0504; H01L 31/05–31/0516
USPC .......................................... 136/244
See application file for complete search history.

(56) References Cited

U.S. PATENT DOCUMENTS

| | | | |
|---|---|---|---|
| 2007/0295381 A1* | 12/2007 | Fujii | ............... H01L 31/022433 136/244 |
| 2011/0073166 A1* | 3/2011 | Lee | ................. H01L 31/022441 136/251 |
| 2013/0098423 A1 | 4/2013 | Shimasaki et al. | |

FOREIGN PATENT DOCUMENTS

| | | |
|---|---|---|
| CN | 201523015 | 7/2010 |
| CN | 201910431 | 7/2011 |
| CN | 102938432 | 2/2013 |
| CN | 102959723 | 3/2013 |
| JP | 2004281800 | 10/2004 |
| TW | M361781 | 7/2009 |
| WO | WO2012-001815 | * 1/2012 |

OTHER PUBLICATIONS

English translation of Shimasaki et al., Wo2012-001815.*

* cited by examiner

*Primary Examiner* — Allison Bourke
*Assistant Examiner* — Niki Bakhtiari
(74) *Attorney, Agent, or Firm* — WPAT, PC; Justin King

(57) ABSTRACT

A photoelectrical conversion module includes at least one photoelectrical conversion device, at least one first ribbon, a second ribbon, and at least two encapsulation layers. The photoelectrical conversion device includes a solar substrate having a plurality of finger electrodes. The first ribbon is located on the solar substrate and is intersected with the finger electrodes. The first ribbon has a first connection portion located out of the solar substrate. The second ribbon has at least one second connection portion. The first connection portion is intersected and overlapped with the second connection portion, such that a portion of the first connection portion is located above the second connection portion, and another portion of the first connection portion is located under the second connection portion. The relative (Continued)

position of the first and second ribbons is fixed by the encapsulation layers.

6 Claims, 9 Drawing Sheets

PHOTOELECTRICAL COVERSION MODULE

RELATED APPLICATIONS

This application claims priority to Chinese Application Serial Number 201310115449.8, filed Apr. 3, 2013, which is herein incorporated by reference.

BACKGROUND

Technical Field

The present disclosure relates to a photoelectrical conversion module.

Description of Related Art

Solar cells convert light energy, particularly sunlight power, into electrical energy. Since this conversion process does not produce greenhouse gases, the solar energy is considered to be one of environmentally friendly ways to generate electricity. As the solar technology progresses and develops, the cost of solar cells recently has lowered considerably. As a result, the solar cells are more and more popular in the consumer market. For example, the solar cells have been widely applied on rooftops of houses and outer walls of buildings, as well as in various electronic products.

In a conventional solar cell, there are plural finger electrodes, a tabbing ribbon, and a bussing ribbon disposed on a light-facing surface thereof. The tabbing ribbon is electrically connected to the finger electrodes. In order to ensure the current transmission of the solar cell, the tabbing ribbon and the solar cell are connected by soldering, and the tabbing ribbon and the bussing ribbon are also connected by soldering. When the solar cell is radiated, the current generated by the solar cell is collected to the tabbing ribbon from the finger electrodes. Thereafter, the current is send to an external power consumption device or an external electricity storage device by the bussing ribbon.

At present, the tabbing ribbon can be connected to the solar cell by an automatic soldering equipment, but the connection between the tabbing and the bussing ribbons needs to be soldered manually. Comparing to the automatic soldering process, the manual soldering process takes more time of soldering and labor cost so that the manufacturing cost increases.

SUMMARY

An aspect of the present invention is to provide a photoelectrical conversion module.

According to an embodiment of the present invention, a photoelectrical conversion module includes at least one photoelectrical conversion device, at least one first ribbon, a second ribbon, and at least two encapsulation layers. The photoelectrical conversion device includes a solar substrate having a plurality of finger electrodes. The first ribbon is disposed on the solar substrate and is intersected with the finger electrodes. The first ribbon has a first connection portion located out of the solar substrate. The second ribbon has at least one second connection portion. The first connection portion is intersected and overlapped with the second connection portion, such that a portion of the first connection portion is located above the second connection portion, and another portion of the first connection portion is located under the second connection portion. One of the two encapsulation layers is located above the photoelectrical conversion device, the first ribbon, and the second ribbon, and the other encapsulation layer is located under the photoelectrical conversion device, the first ribbon, and the second ribbon, such that a relative position of the first and second ribbons is fixed by the two encapsulation layers.

In an embodiment of the present invention, the first connection portion has a notch at an overlapped position of the first and second connection portions.

In an embodiment of the present invention, the photoelectrical conversion module further includes a light transmissive protection element. The light transmissive protection element covers the encapsulation layer that is located above the photoelectrical conversion device.

In an embodiment of the present invention, the photoelectrical conversion module further includes a backsheet. The backsheet is disposed under the encapsulation layer located under the photoelectrical conversion device.

In an embodiment of the present invention, the thickness of the first ribbon is in a range from 0.1 to 0.2 mm.

In an embodiment of the present invention, the thickness of the second ribbon is in a range from 0.25 to 0.35 mm.

An aspect of the present invention is to provide a photoelectrical conversion module.

According to an embodiment of the present invention, a photoelectrical conversion module includes at least one photoelectrical conversion device, at least one first ribbon, a second ribbon, and at least two encapsulation layers. The photoelectrical conversion device includes a solar substrate having a plurality of finger electrodes. The first ribbon is disposed on the solar substrate and is intersected with the finger electrodes. The first ribbon has a first connection portion located out of the solar substrate. The second ribbon has at least one second connection portion. The second connection portion has a through hole. The first connection portion is intersected and overlapped with the second connection portion, such that at least a portion of the first connection portion is located in the through hole. One of the two encapsulation layers is located above the photoelectrical conversion device, the first ribbon, and the second ribbon, and the other encapsulation layer is located under the photoelectrical conversion device, the first ribbon, and the second ribbon, such that a relative position of the first and second ribbons is fixed by the two encapsulation layers.

In an embodiment of the present invention, the photoelectrical conversion module further includes a light transmissive protection element. The light transmissive protection element covers the encapsulation layer that is located above the photoelectrical conversion device.

In an embodiment of the present invention, the photoelectrical conversion module further includes a backsheet. The backsheet is disposed under the encapsulation layer located under the photoelectrical conversion device.

In an embodiment of the present invention, the thickness of the first ribbon is in a range from 0.1 to 0.2 mm.

In an embodiment of the present invention, the thickness of the second ribbon is in a range from 0.25 to 0.35 mm.

An aspect of the present invention is to provide a photoelectrical conversion module.

According to an embodiment of the present invention, a photoelectrical conversion module includes at least one photoelectrical conversion device, at least one first ribbon, a second ribbon, and at least two encapsulation layers. The photoelectrical conversion device includes a solar substrate having a plurality of finger electrodes. The first ribbon is disposed on the solar substrate and is intersected with the finger electrodes. The first ribbon has a first connection portion located out of the solar substrate. The second ribbon has at least one second connection portion. The first connection portion is bended to overlap on a top surface and a bottom surface of the second connection portion. One of the two encapsulation layers is located above the photoelectrical conversion device, the first ribbon, and the second ribbon, and the other encapsulation layer is located under the photoelectrical conversion device, the first ribbon, and the second ribbon, such that a relative position of the first and second ribbons is fixed by the two encapsulation layers.

In an embodiment of the present invention, the second connection portion has a concave portion. The concave portion is abutted against a bended position of the first connection portion for limiting a position of the first connection portion.

In an embodiment of the present invention, the photoelectrical conversion module further includes a light transmissive protection element. The light transmissive protection element covers the encapsulation layer that is located above the photoelectrical conversion device.

In an embodiment of the present invention, the photoelectrical conversion module further includes a backsheet. The backsheet is disposed under the encapsulation layer located under the photoelectrical conversion device.

In an embodiment of the present invention, the thickness of the first ribbon is in a range from 0.1 to 0.2 mm.

In an embodiment of the present invention, the thickness of the second ribbon is in a range from 0.25 to 0.35 mm.

In the aforementioned embodiments of the present invention, the first connection portion of the first ribbon protrudes from the solar substrate, and the second connection portion of the second ribbon are connected by an engaging structure. When the two encapsulation layers and the solar substrate are laminated, the relative position of the first and second ribbons can be fixed. As a result, the soldering process performed between the first and second ribbons can be omitted. If the two encapsulation layers are separated from the photoelectrical conversion device in the future, the electrical connection of the photoelectrical conversion module can be retained. In the other words, the photoelectrical conversion module can reduce the time of soldering and the labor cost.

Moreover, since the process of laminating the two encapsulation layers on the solar substrate is required to manufacture a conventional photoelectrical conversion module, the same process can be adopted without any modification and additional cost.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
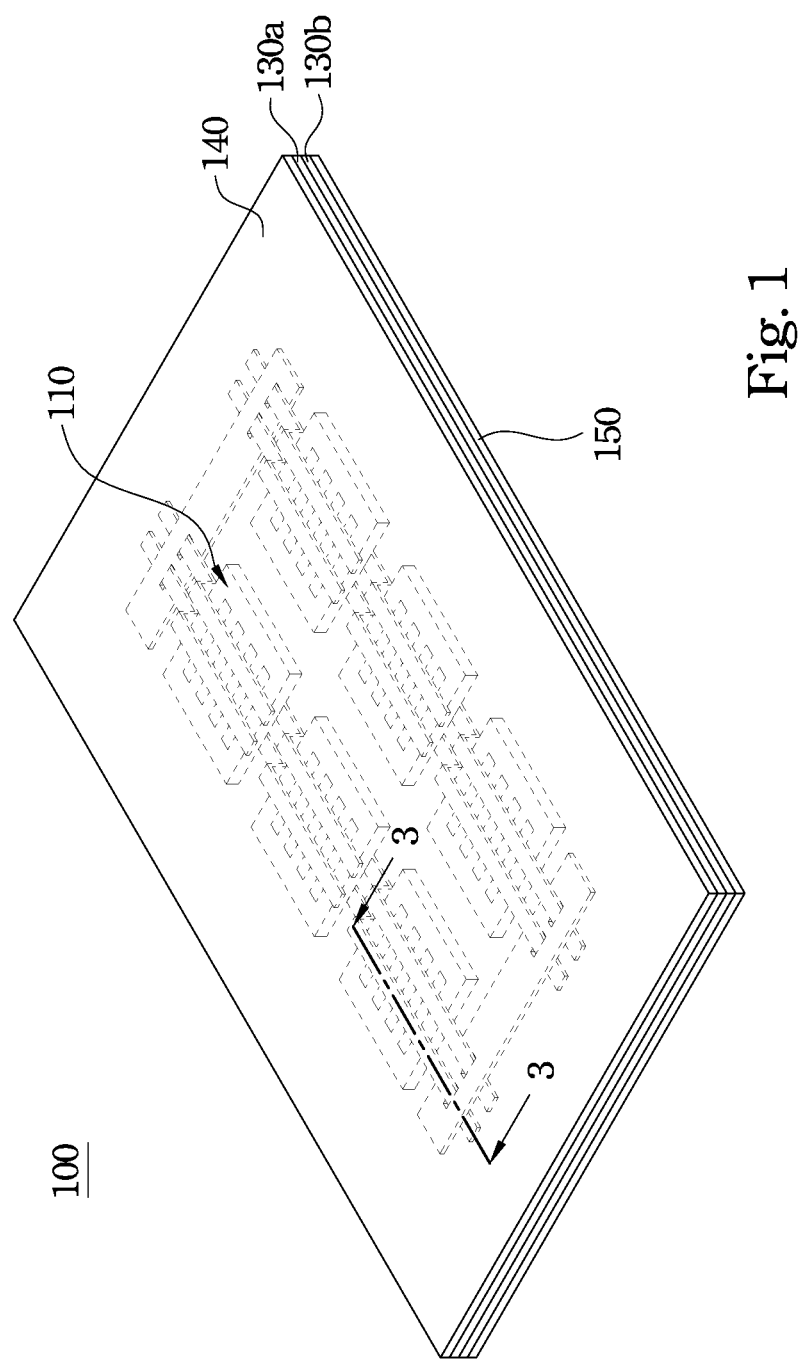
FIG. 1 is a perspective view of a photoelectrical conversion module according to an embodiment of the present invention.
Figure 2:
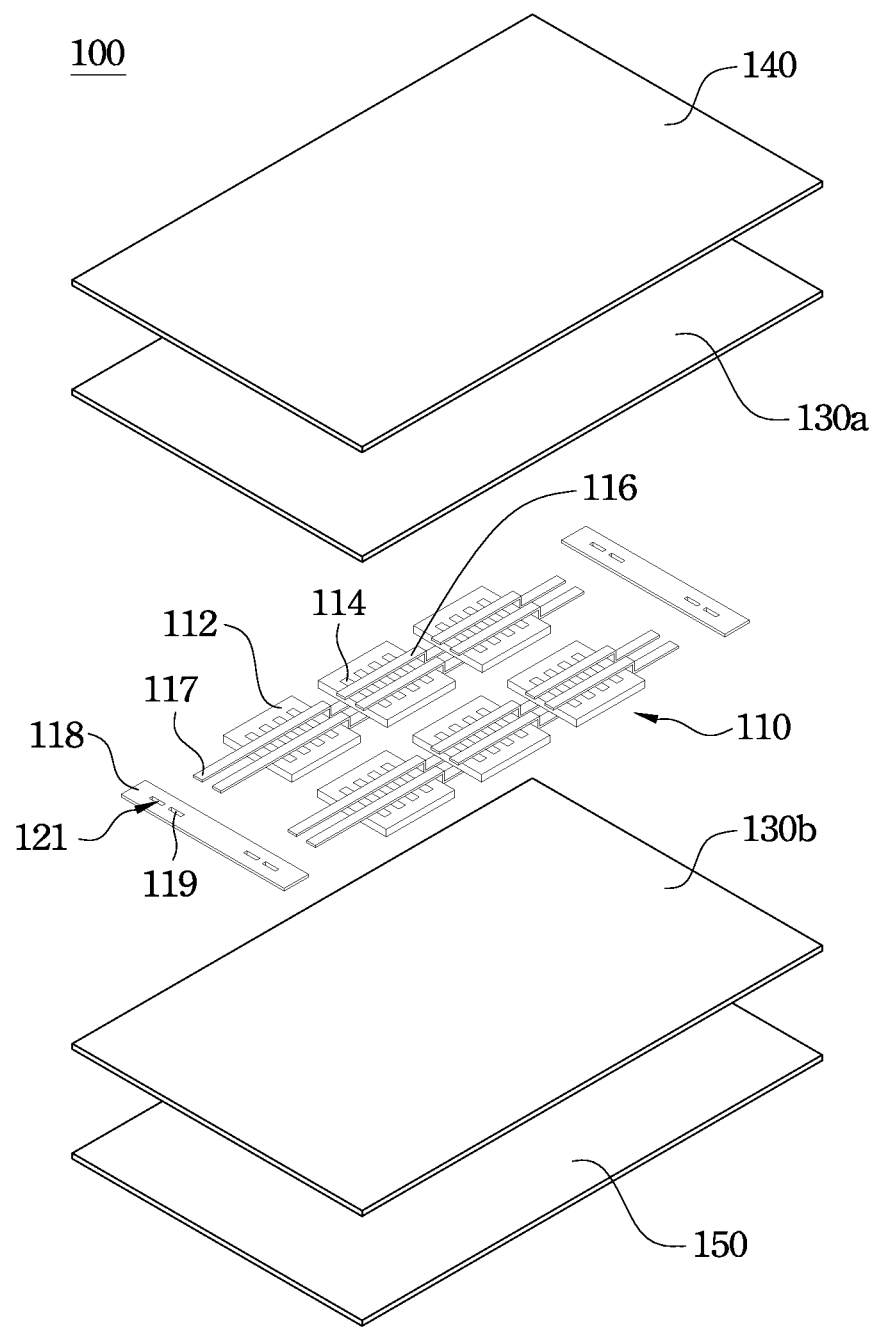
FIG. 2 is an exploded view of the photoelectrical conversion module shown in FIG. 1.

FIG. 1 is a perspective view of a photoelectrical conversion module 100 according to an embodiment of the present invention. FIG. 2 is an exploded view of the photoelectrical conversion module 100 shown in FIG. 1. As shown in FIG. 1 and FIG. 2, the photoelectrical conversion module 100 includes plural photoelectrical conversion devices 110, plural first ribbons 116, at least one second ribbon 118, and two encapsulation layers 130a, 130b. Each of the photoelectrical conversion devices 110 includes a solar substrate 112 having plural finger electrodes 114 thereon. The top surface of the solar substrate 112 may have plural strip electrodes (not shown), and the bottom surface of the solar substrate 112 may have plural backside electrodes (not shown). The finger electrodes 114 are located on the top surface of the solar substrate 112 and are in a parallel arrangement. The first ribbons 116 are located on at least one of the solar substrates 112 for electrically connecting two adjacent photoelectrical conversion devices 110. The length of each of the first ribbons 116 is greater then the length of the solar substrate 112. The first ribbons 116 are intersected with the finger electrodes 114. On the terminal of the strip of the photoelectrical conversion devices 110, one end of the first ribbons 116 has a first connection portion 117 to connect the second ribbon 118, and the first connection portion 117 is located outside of the solar substrate 112 and does not overlap the solar substrate 112. In other words, the first connection portion 117 extends outwards from the solar substrate 112. The extending direction of the second ribbon 118 is substantially perpendicular to the extending direction of the first ribbons 116. The second ribbon 118 has plural second connection portions 119 to respectively engage with each of the perpendicular-extending first connection portions 117. The encapsulation layer 130a is located above the photoelectrical conversion device 110, the first ribbon 116, and the second ribbon 118, and the encapsulation layer 130b is located under the photoelectrical conversion device 110, the first ribbon 116, and the second ribbon 118, such that a relative position of the first and second ribbons 116, 118 can be fixed by the two encapsulation layers 130a, 130b.

Moreover, the photoelectrical conversion module 100 may further include a light transmissive protection element 140 and a backsheet 150. The light transmissive protection element 140 covers the encapsulation layer 130a and faces the finger electrodes 114. The encapsulation layer 130b is located between the backsheet 150 and the light transmissive protection element 140. The encapsulation layers 130a, 130b and the photoelectrical conversion device 110 are located between the backsheet 150 and the light transmissive protection element 140. The encapsulation layer 130a has light transmittance. When the light-facing surface of the photoelectrical conversion module 100 covered by the light transmissive protection element 140 is radiated by a light (e.g., sunlight), the current generated by the solar substrate 112 is collected to the first ribbon 116 from the finger electrodes 114. Thereafter, the current can be send to an external power consumption device or an external electricity storage device by the second ribbon 118 engaged with the first ribbon 116.

In this embodiment, the solar substrate 112 can convert light energy into electrical energy. The solar substrate 112 includes a laminated photoelectric conversion layer having p-n junction, p-i-n junction, or heterojunction. The photoelectric conversion layer may be made of a material that includes amorphous silicon, single crystal silicon, silicon heterojunction, poly silicon, cadmium diselenide (CdS), cadmium telluride (CdTe), copper indium selenide (CIS), or copper indium gallium diselenide (CIGS), but the photoelectric conversion layer is not limited by the aforesaid materials. In addition, the solar substrate 112 may be manufactured by a chemical vapor deposition (CVD) method, a physical vapor deposition (PVD) method, a sputtering deposition method, or other deposition methods.

Furthermore, the finger electrodes 114, the first and second ribbons 116, 118 may be made of the material including copper, silver, gold, nickel, aluminum, an alloy, or other conductive materials. The thickness of the first ribbon 116 may be in a range from 0.1 to 0.2 mm, and the thickness of the second ribbon 118 may be in a range from 0.25 to 0.35 mm. The finger electrodes 114 may be formed on the solar substrate 112 by a screen-printing method. The light transmissive protection element 140 has light transmittance, such that a light can enter the photoelectrical conversion device 110. The light transmissive protection element 140 may be made of a material that includes plastic, glass, fluorides, or polymer films. However, other materials having high transparency, light weight, flexibility may be used to manufacture the light transmissive protection element 140. The encapsulation layers 130a, 130b may be made of the material including ethylene vinyl acetate (EVA) or silicone. The backsheet 150 may be made of the material including polyvinyl fluoride (PVF), such as Tedlar composite material, or polyethylene terephthalate (PET) coated with fluoride layer.

Figure 3:
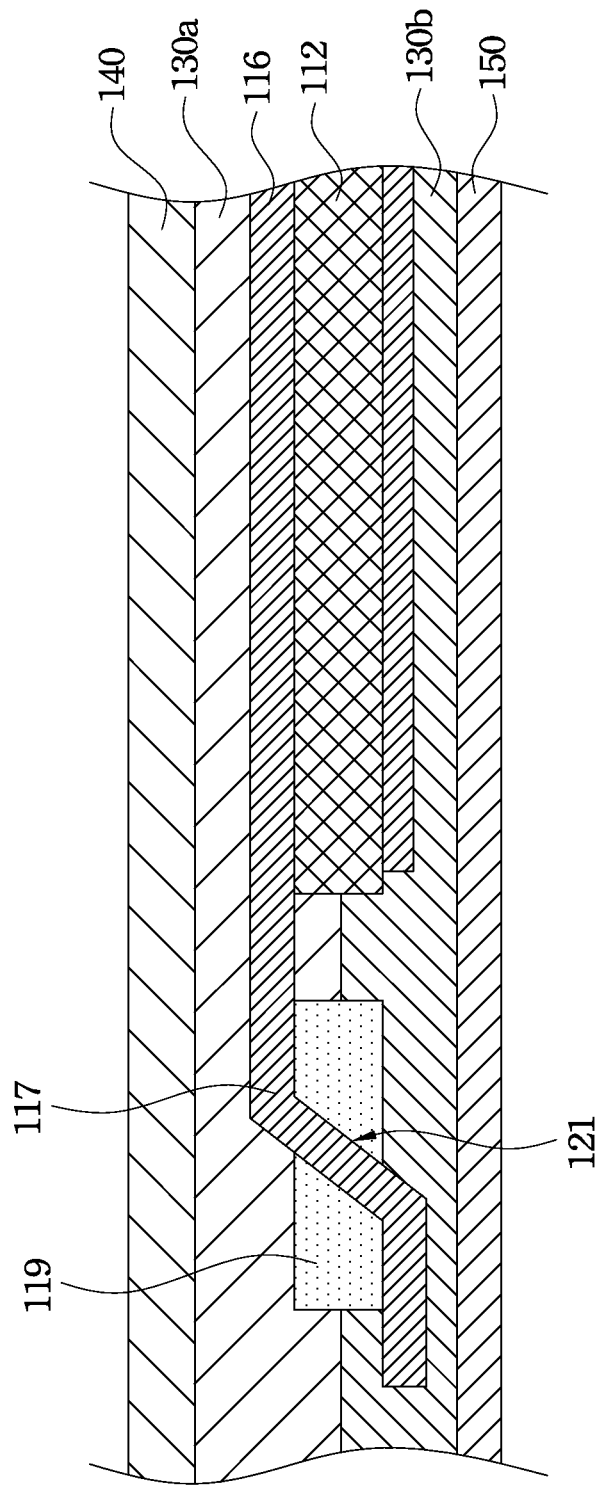
FIG. 3 is a cross-sectional view taken along line 3-3 shown in FIG. 1.

FIG. 3 is a cross-sectional view taken along line 3-3 shown in FIG. 1. As shown in FIG. 2 and FIG. 3, in this embodiment, the second connection portion 119 of the second ribbon 118 has a slit 121, such that the first connection portion 117 of the first ribbon 116 can be inserted into the slit and engaged with the second connection portion 119. As a result, when the first connection portion 117 is engaged with the second connection portion 119, a portion of the first connection portion 117 is located above the second connection portion 119, and another portion of the first connection portion 117 is located under the second connection portion 119.

When manufacturing the photoelectrical conversion module 100, the solar substrate 112 may be provided, and the finger electrodes 114 are formed on the surface of the solar substrate 112. Thereafter, the first ribbon 116 is arranged on the solar substrate 112 in a direction that is perpendicular to the finger electrodes 114. On the terminal of strip of the photoelectrical conversion devices 110, there is the first connection portion 117 of the first ribbon 116 extending outwords from the solar substrate 112. Subsequently, the first connection portion 117 of the first ribbon 116 is inserted into and passes through the slit 121 formed on the second connection portion 119 of the second ribbon 118. The length of the first connection portion 117 penetrating through the slit 121 may be substantially more than the width of the second ribbon 118, such that the second ribbon 118 is certainly engaged with the first ribbon 116. Next, the solar substrate 112 connected to the first and second ribbons 116, 118 is disposed between the encapsulation layers 130a, 130b, and the encapsulation layers 130a, 130b can be pressed on the solar substrate 112, such that the relative position of the first and second ribbons 116, 118 can be fixed by the encapsulation layers 130a, 130b.

As a result, the soldering process performed between the first and second ribbons 116, 118 can be omitted. Even in the condition that the two encapsulation layers 130a, 130b are separated from the photoelectrical conversion device 110 in the future, the current of the photoelectrical conversion module 100 can still output. It means that this new structure can reduce the soldering time for connecting the first ribbon 116 and the second ribbon 118 and related labor cost for operation in the photoelectrical conversion module 100 manufacturing process. Moreover, since the encapsulation is the fundamental step for photoelectrical conversion module manufacturing process, this invention can be applied without further cost increasing.

In addition, the first and second ribbons 116, 118 may be strip-shaped metal sheets made of copper with tin plated on the surface of copper. The melting point of the tin is less than or equal to 140° C., and the operating temperature for encapsulation process of making photoelectrical conversion module ranges from 140 to 160° C. Therefore during this process, the tin on the ribbons surface are melt and solidified again when the process is completed. Then, the first connection portion 117 is electrically connected to the second connection portion 119, and the relative position of the first and second connection portions 117, 119 is more secure.

Figure 4:
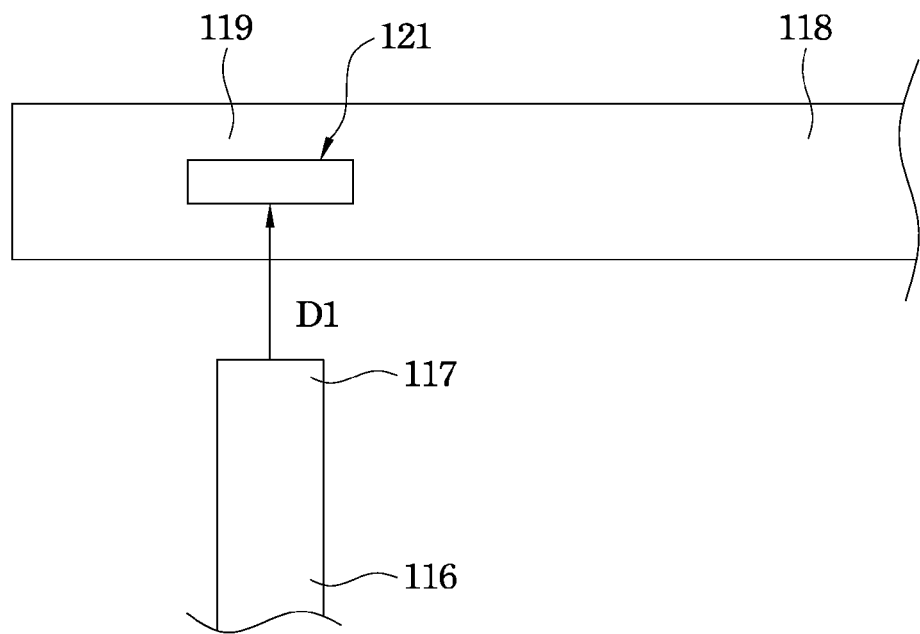
FIG. 4 is a top view of a first ribbon and a second ribbon according to an embodiment of the present invention, shown in a state before engaging with each other.
Figure 5:
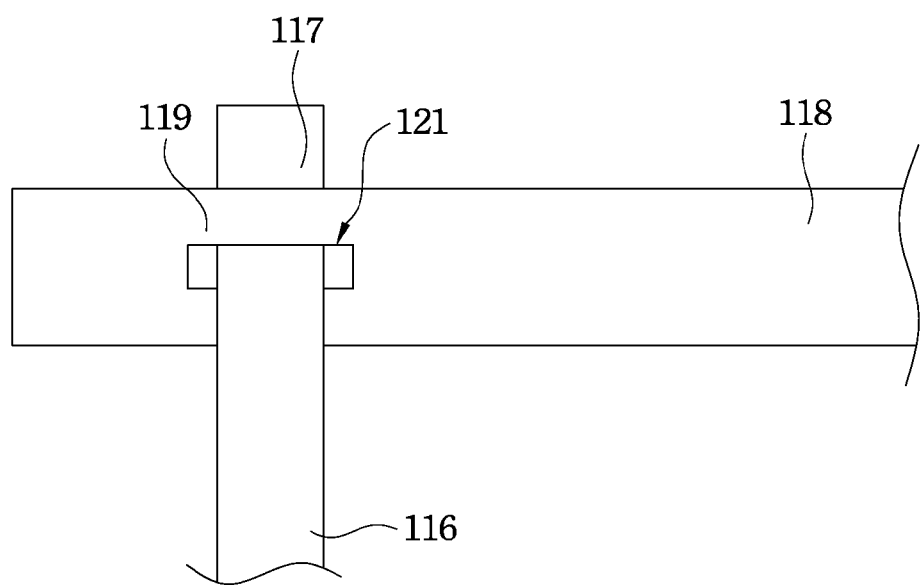
FIG. 5 is a top view of the first and second ribbons shown in FIG. 4 after engaging with each other.

FIG. 4 is a top view of a first ribbon 116 and a second ribbon 118 according to an embodiment of the present invention, shown in a state before engaging with each other. FIG. 5 is a top view of the first and second ribbons 116, 118 shown in FIG. 4 after engaging with each other. As shown in FIG. 4 and FIG. 5, when connecting the first and second ribbons 116, 118, the first connection portion 117 of the first ribbon 116 can be inserted into the slit 121 formed on the second connection portion 119 of the second ribbon 118 in a direction D1. The opening length of the slit 121 is substantially greater than the width of the first ribbon 116. Therefore, the slit 121 can previously position the first and second ribbons 116, 118 to prevent the first and second ribbons 116, 118 from horizontal displacement.

It is to be noted that the elements described above and the material of the elements described above will not be repeated in the following description, and only aspects related to the different types of the first and second connection portions 117, 119 will be explained.

Figure 6:
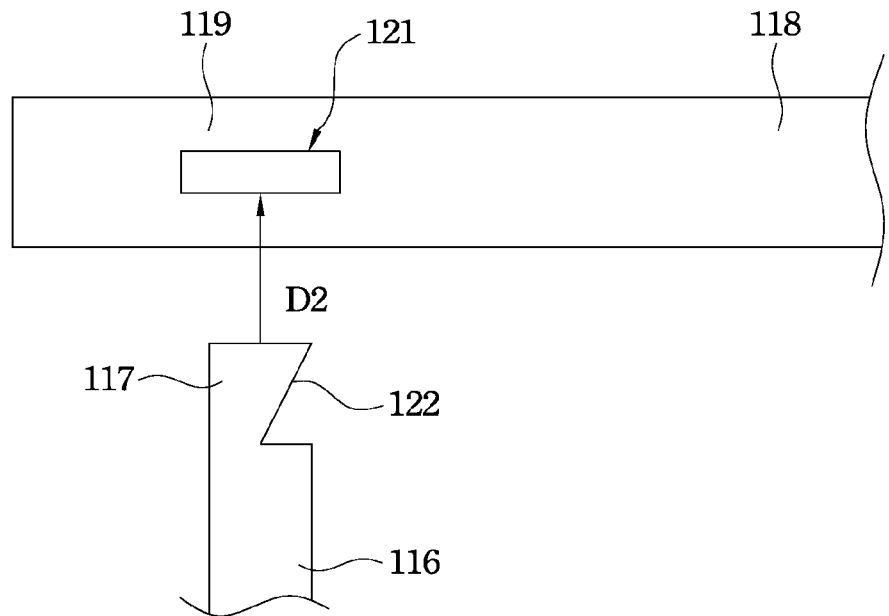
FIG. 6 is a top view of a first ribbon and a second ribbon according to an embodiment of the present invention, shown in a state before engaging with each other.
Figure 7:
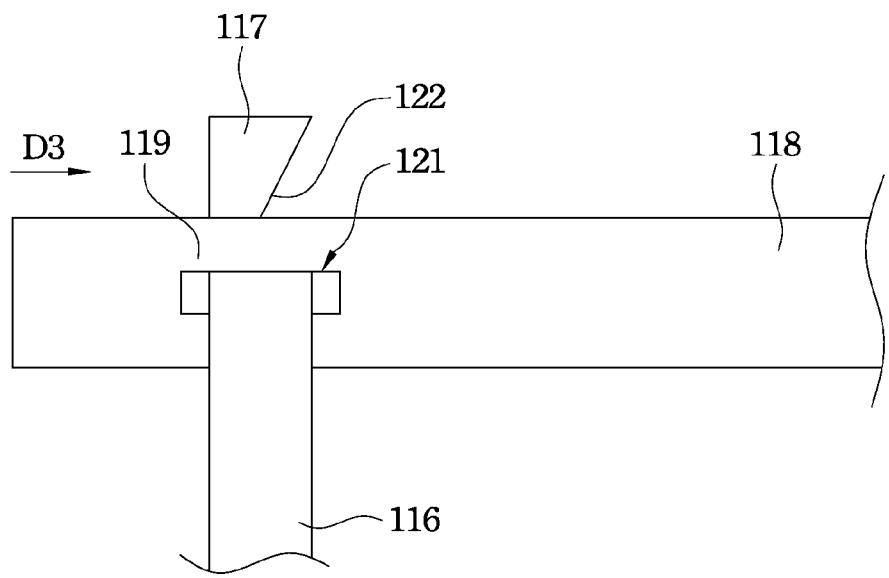
FIG. 7 is a top view of the first ribbon inserted into and passing through a slit that is formed on the second ribbon shown in FIG. 6.

FIG. 6 is a top view of a first ribbon 116 and a second ribbon 118 according to an embodiment of the present invention, shown in a state before engaging with each other. FIG. 7 is a top view of the first ribbon 116 inserted into and passing through the slit 121 formed on the second ribbon 118 shown in FIG. 6. As shown in FIG. 6 and FIG. 7, when connecting the first and second ribbons 116, 118, the first connection portion 117 of the first ribbon 116 can be inserted into the slit 121 formed on the second connection portion 119 of the second ribbon 118 in a direction D2. The difference between this embodiment and the embodiment shown in FIG. 4 and FIG. 5 is that a notch 122 is formed on the first connection portion 117 at overlapped position of the first and second connection portions 117, 119.

Figure 8:
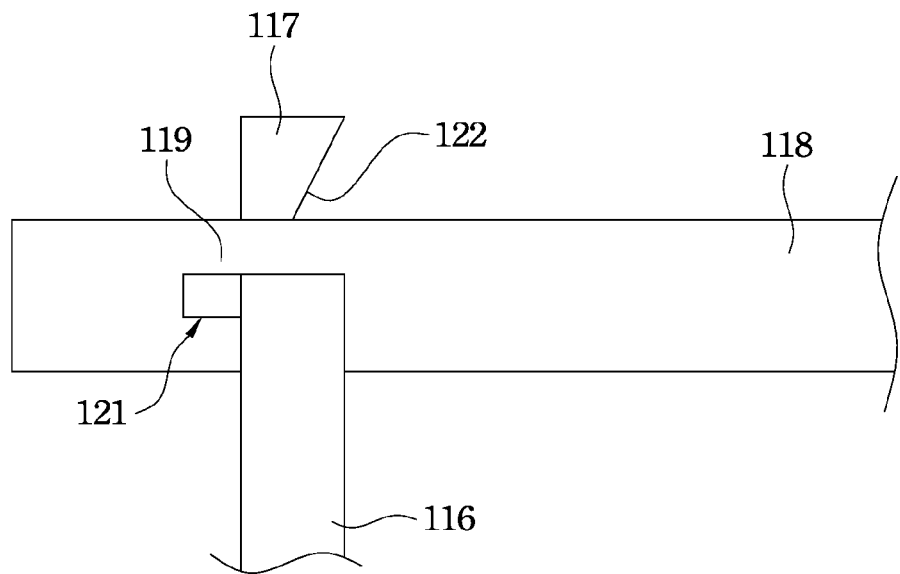
FIG. 8 is a top view of the first and second ribbons shown in FIG. 7 after engaging with each other.

FIG. 8 is a top view of the first and second ribbons 116, 118 shown in FIG. 7 after engaging with each other. As shown in FIG. 7 and FIG. 8, after the first connection portion 117 of the first ribbon 116 is inserted into the slit 121 formed on the second connection portion 119 of the second ribbon 118, the first connection portion 117 of the first ribbon 116 can be moved in a direction D3, or the second ribbon 118 can be moved in a reverse direction of the direction D3, such that the notch 122 formed on the first connection portion 117 is engaged with the edge of the slit 121 formed on the second connection portion 119. The slit 121 and the notch 122 can previously position the second ribbon 118 before encapsulation to prevent the second ribbon 118 from horizontal and vertical displacements.

Figure 9:
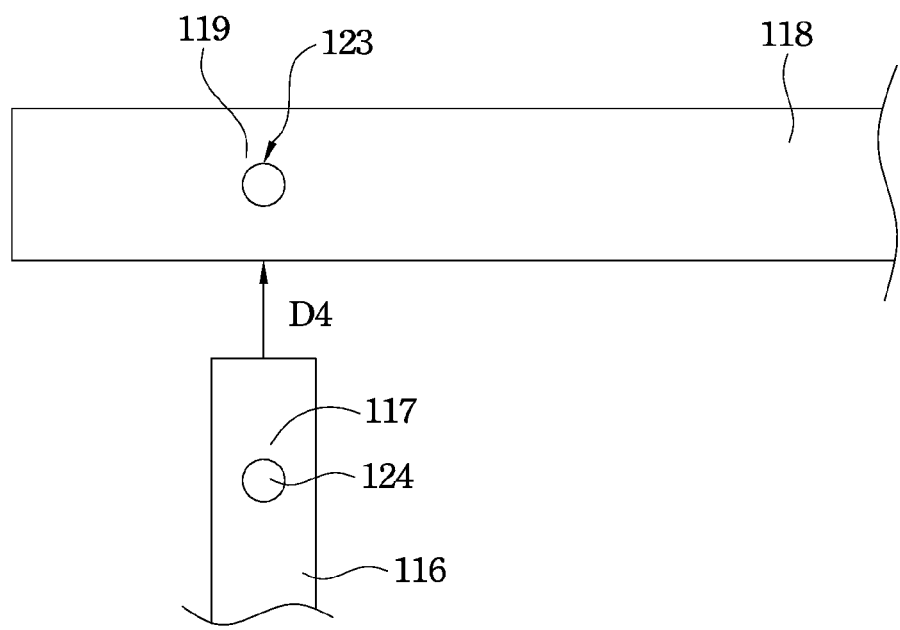
FIG. 9 is a top view of a first ribbon and a second ribbon according to an embodiment of the present invention, shown in a state before engaging with each other.
Figure 10:
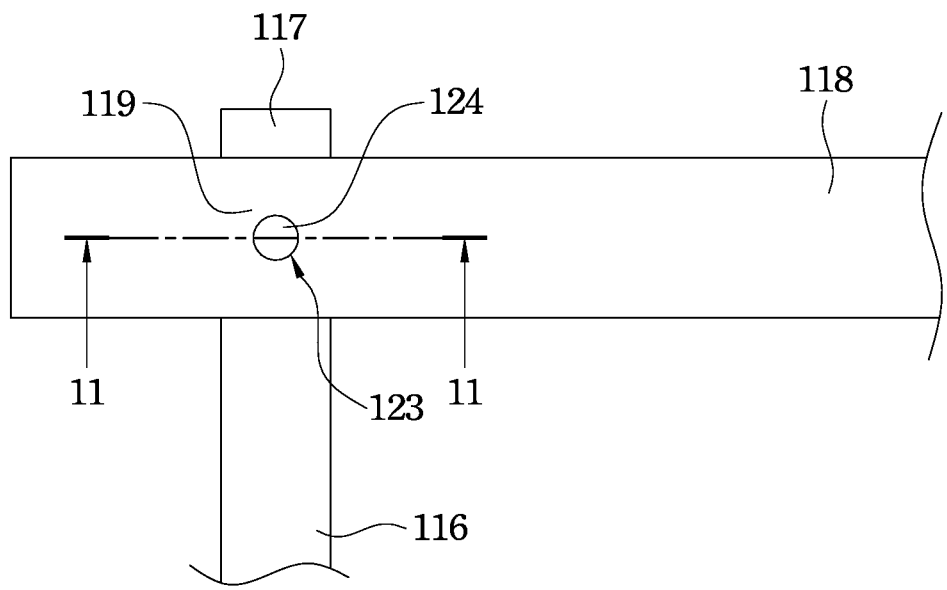
FIG. 10 is a top view of the first and second ribbons shown in FIG. 9 after engaging with each other.

FIG. 9 is a top view of a first ribbon 116 and a second ribbon 118 according to an embodiment of the present invention, shown in a state before engaging with each other. FIG. 10 is a top view of the first and second ribbons 116, 118 shown in FIG. 9 after engaging with each other. As shown in FIG. 9 and FIG. 10, the first connection portion 117 of the first ribbon 116 further includes a protruding point 124, and the second connection portion 119 of the second ribbon 118 further includes a through hole 123. When engaging the first and second ribbons 116, 118, the first connection portion 117 of the first ribbon 116 is moved in a direction D4 to the bottom side of the second ribbon 118, and the protruding point 124 is aligned with the through hole 123. Thereafter, when the first ribbon 116 and the second ribbon 118 are pressed together, the protruding point 124 is coupled in the through hole 123. The first connection portion 117 is intersected and overlapped with the second connection portion 119, such that at least a portion of the first connection portion 117 is located in the through hole 123 of the second connection portion 119. In this embodiment, the through hole 123 and the protruding point 124 can fix the first ribbon 116 and the second ribbon 118 before encapsulation.

Figure 11:
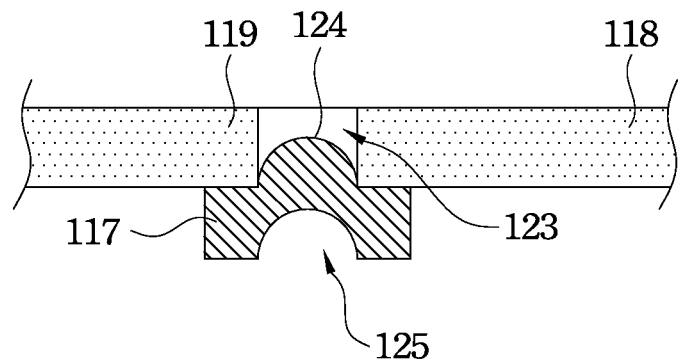
FIG. 11 is a cross-sectional view taken along line 11-11 shown in FIG. 10.

FIG. 11 is a cross-sectional view taken along line 11-11 shown in FIG. 10. As shown in FIG. 11, a recess 125 is on the opposite side of the protruding point 124 on the first connection portion 117. In this embodiment, the protruding point 124 can be formed by punching one side of the first connection portion 117 so that the protruding point 124 and the recess 125 are formed at the same time. Therefore, the protruding point 124 and the recess 125 are respectively formed on the top and bottom surfaces of the first connection portion 117. However, the present invention is not limited by details in this embodiment.

Figure 12:
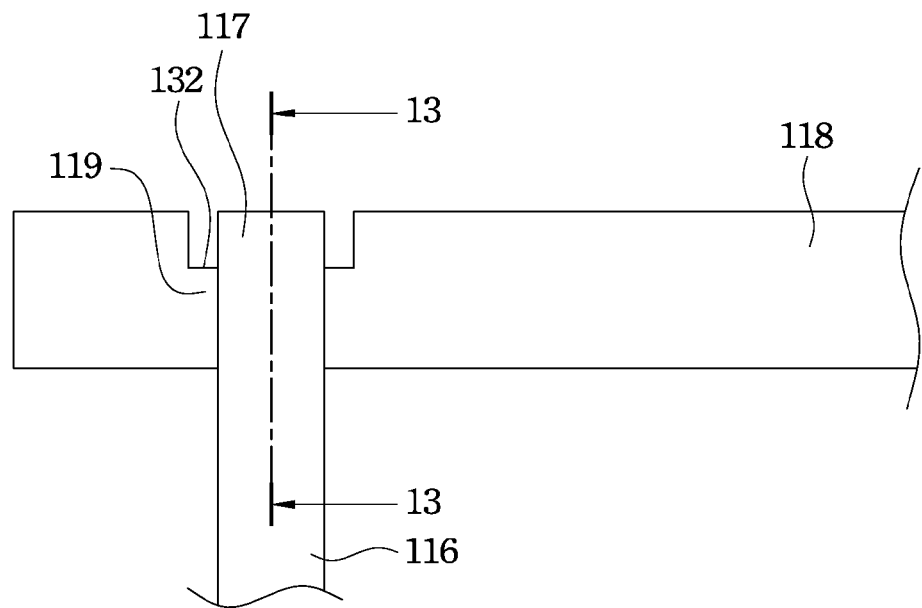
FIG. 12 is a top view of a first ribbon and a second ribbon according to an embodiment of the present invention, shown in a state after engaging with each other.
Figure 13:
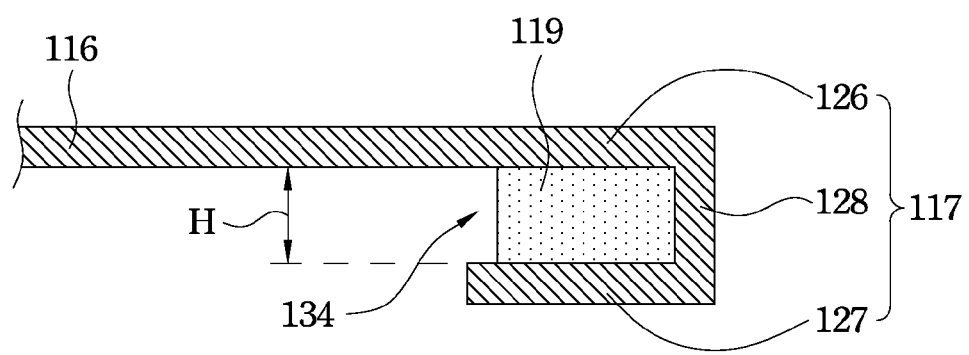
FIG. 13 is a cross-sectional view taken along line 13-13 shown in FIG. 12.

FIG. 12 is a top view of a first ribbon 116 and a second ribbon 118 according to an embodiment of the present invention, shown in a state after engaging with each other. FIG. 13 is a cross-sectional view taken along line 13-13 shown in FIG. 12. As shown in FIG. 12 and FIG. 13, the first connection portion 117 of the first ribbon 116 has a top wall 126, a bottom board 127, and a sidewall 128. The top wall 126 is connected to the end of the first ribbon 116. The bottom board 127 is parallel to the top wall 126. The sidewall 128 is connected between the top wall 126 and the bottom board 127, such that an accommodating space 134 is formed between the top wall 126, the sidewall 128, and the bottom board 127. When the first ribbon 116 is engaged with the second ribbon 118, the second connection portion 119 of the second ribbon 118 can be accommodated in the accommodating space 134, such that the second connection portion 119 is positioned between the top wall 126, the bottom board 127, and the sidewall 128. That is to say, the first connection portion 117 is bended to overlap on the top and bottom surfaces of the second connection portion 119. In this embodiment, the distance H between the top wall 126 and the bottom board 127 is substantially equal to the thickness of the second ribbon 118.

Moreover, in this embodiment, the second connection portion 119 of the second ribbon 118 has a concave portion 132 located at an edge of the second ribbon 118. The first connection portion 117 is bended above the second connection portion 119 to engage with the concave portion 132, such that the sidewall 128 of the first connection portion 117 is abutted against the edge of the concave portion 132 for limiting the position of the first connection portion 117. In this embodiment, the top wall 126, the sidewall 128, and the bottom board 127 of the first connection portion 117, and the concave portion 132 of the second connection portion 119 can previously position the second ribbon 118 before encapsulation.

In addition, the top wall 126, the sidewall 128, and the bottom board 127 of the first connection portion 117 are formed by bending the first connection portion 117, such that the second connection portion 119 of the second ribbon 118 can be accommodated in the accommodating space 134 formed between the top wall 126, the sidewall 128, and the bottom board 127.

Figure 14:
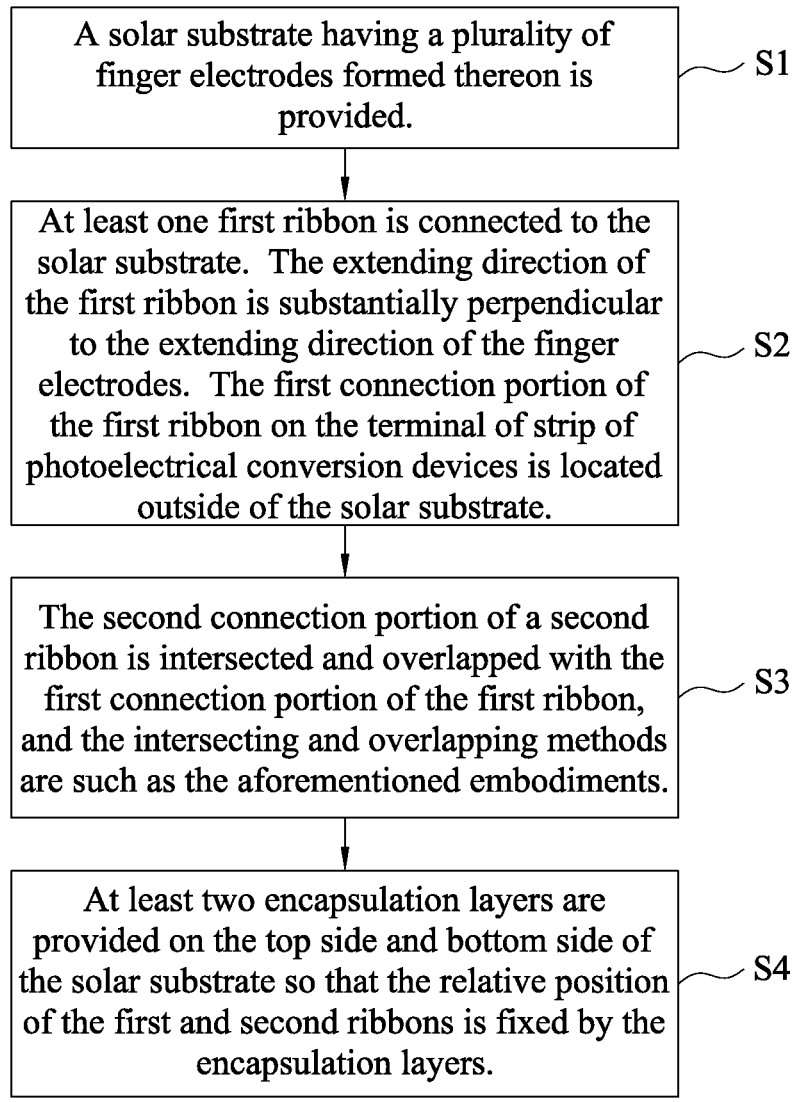
FIG. 14 is a flow chart of a manufacturing method of a photoelectrical conversion module according to an embodiment of the present invention.

FIG. 14 is a flow chart of a manufacturing method of a photoelectrical conversion module according to an embodiment of the present invention. In step S1, a solar substrate having a plurality of finger electrodes formed thereon is provided. Thereafter in step S2, at least one first ribbon is connected to the solar substrate. The extending direction of the first ribbon is substantially perpendicular to the extending direction of the finger electrodes. The first connection portion of the first ribbon on the terminal of strip of photoelectrical conversion devices is located outside of the solar substrate. Next in step S3, the second connection portion of a second ribbon is intersected and overlapped with the first connection portion of the first ribbon, and the intersecting and overlapping methods are such as the aforementioned embodiments. Finally in step S4, at least two encapsulation layers are provided on the top side and bottom side of the solar substrate so that the relative position of the first and second ribbons is fixed by the encapsulation layers.

Compared with the prior art and the photoelectrical conversion module of the present invention, the second connection portion of the second ribbon is connected to the first connection portion of the first ribbon by an engaging structure. When the encapsulation layer and the solar substrate are laminated, the relative position of the first and second ribbons can be fixed and the electrical connection between the first and second ribbons can be formed at the same time. As a result, the soldering process performed between the first and second ribbons can be omitted. Even If the encapsulation layer is separated from the photoelectrical conversion device in the future, the electric connection of the photoelectrical conversion module can be ensured. In other words, the new design of photoelectrical conversion module can reduce the time for soldering and the labor cost. Furthermore, since the process of laminating the encapsulation layer and the solar substrate is required to manufacture a conventional photoelectrical conversion module, the same process can be adopted without any modification and additional cost.

The foregoing disclosure is sufficient to enable one having skill in the art to practice the invention without undue experimentation, and provides the best mode of practicing the invention presently contemplated by the inventor. While there is provided herein a full and complete disclosure of the preferred embodiments of this invention, it is not intended to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Accordingly, the proper scope of the present invention should be determined only by the broadest interpretation of the appended claims so as to encompass all such modifications as well as all relationships equivalent to those illustrated in the drawings and described in the specification.

What is claimed is:

1. A photoelectrical conversion module comprising:
    At least one photoelectrical conversion device comprising:
    A solar substrate having a plurality of finger electrodes;
    At least one first ribbon disposed on the solar substrate and intersected with the finger electrodes, wherein the first ribbon has a first connection portion located out of the solar substrate;
    A second ribbon having at least one second connection portion, wherein the first connection portion is intersected and overlapped with the second connection portion, such that a portion of the first connection portion overlapped with the second connection portion is located above the second connection portion, and another portion of the first connection portion overlapped with the second connection portion is located under the second connection portion, wherein the second connection portion has a slit, and the first connection portion is inserted into the slit and engaged with the second connection portion; and
    At least two encapsulation layers, wherein one of the two encapsulation layers is located above the photoelectrical conversion device, the first ribbon, and the second ribbon, and the other encapsulation layer is located under the photoelectrical conversion device, the first ribbon, and the second ribbon, such that a relative position of the first and second ribbons is fixed by the two encapsulation layers.

2. The photoelectrical conversion module of claim 1, wherein the first connection portion has a notch at an overlapped position of the first and second connection portions.

3. The photoelectrical conversion module of claim 1, further comprising:
    a light transmissive protection element covering the encapsulation layer that is located above the photoelectrical conversion device.

4. The photoelectrical conversion module of claim 3, further comprising:
    a backsheet disposed under the encapsulation layer located under the photoelectrical conversion device.

5. The photoelectrical conversion module of claim 1, wherein a thickness of the first ribbon is in a range from 0.1 to 0.2 mm.

6. The photoelectrical conversion module of claim 1, wherein a thickness of the second ribbon is in a range from 0.25 to 0.35 mm.

* * * * *